(12) United States Patent
Stikvoort

(10) Patent No.: US 6,346,860 B2
(45) Date of Patent: Feb. 12, 2002

(54) RESONATOR

(75) Inventor: Eduard Ferdinand Stikvoort, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/804,016

(22) Filed: Mar. 12, 2001

(30) Foreign Application Priority Data

Mar. 14, 2000 (EP) ............................................. 00200924

(51) Int. Cl.[7] .............................. H03F 3/04; H03F 3/191
(52) U.S. Cl. ........................ 330/303; 330/305; 330/294
(58) Field of Search ................................. 330/107, 109, 330/260, 294, 303, 305; 327/552, 553

(56) References Cited

U.S. PATENT DOCUMENTS

| | | | | |
|---|---|---|---|---|
| 4,786,880 A | | 11/1988 | Voorman | 330/294 |
| 4,914,408 A | | 4/1990 | Voorman | 333/167 |
| 4,926,135 A | * | 5/1990 | Voorman | 330/107 |
| 5,105,163 A | * | 4/1992 | Voorman | 330/107 |
| 5,264,805 A | * | 11/1993 | Yokozaki | 330/107 |
| 5,880,634 A | * | 3/1999 | Babanezhad | 330/126 |
| 5,994,966 A | | 11/1999 | Stikvoort | 330/306 |

* cited by examiner

*Primary Examiner*—Robert Pascal
*Assistant Examiner*—Henry Choe
(74) *Attorney, Agent, or Firm*—Steven R. Biren

(57) ABSTRACT

Resonator comprising first and second balanced integrators (I1, I2) each composed with a balanced amplifier and having a non-inverting (in+) and an inverting (in−) input terminal, as well as a non-inverting (out+) and an inverting (out−) output terminal. First and second coupling circuits (Y1, Y2) are interconnected between the non-inverting output terminal (out+) of the first integrator (I1) and the non-inverting input terminal (in+) of the second integrator (I2) and between the inverting output terminal (out−) of the first integrator (I1) and the inverting input terminal (in−) of the second integrator (I2) respectively. Feedback circuits (Y3, Y4) are interconnected between the non-inverting output terminal (out+) of the second integrator (I2) and the inverting input terminal (in−) of the first integrator (I1) and between the inverting output terminal (out−) of the second integrator (I2) and the non-inverting input terminal (in+) of the first integrator (I1) respectively. The balanced integrators (I1, I2) are constituted by two semiconductor elements (T1, T2) interconnected as a differential amplifier, in which a feedback capacitor (C1, C2) is directly connected between the output terminal (out+, out−) and the input terminal (in+, in−) of each semiconductor element (T1, T2). At least one of the coupling and feedback circuits (Y1, Y2, Y3, Y4) comprises a series connection of a high-to-low impedance converter (T3) and a conductance (G).

9 Claims, 2 Drawing Sheets

RESONATOR

BACKGROUND OF INVENTION

The invention relates to a resonator comprising first and second balanced integrators each having a non-inverting and an inverting input terminal, as well as a non-inverting and an inverting output terminal, first and second coupling circuits between the non-inverting output terminal of the first integrator and the non-inverting input terminal of the second integrator and between the inverting output terminal of the first integrator and the inverting input terminal of the second integrator, respectively, and feedback circuits between the non-inverting output terminal of the second integrator and the inverting input terminal of the first integrator and between the inverting output terminal of the second integrator and the non-inverting input terminal of the first integrator, respectively.

U.S. Pat. No. 4,926,135 discloses a balanced integrator-filter arrangement. An active RC filter consists of a balanced amplifier in combination with various resistors and capacitors; it can be extended to obtain an n-th order filter arrangement. Once an n-th order filter arrangement has been obtained, it can be modified to obtain various special purpose filters, such as a low-pass, a high-pass or an all-pass n-th order active RC filter by merely changing the values of the resistors and capacitors.

It is, inter alia, an object of the invention to provide a resonator in which the tuning frequency and/or the dynamic range are improved over prior art resonators. To this end, the invention provides a resonator as defined in the independent claim. Advantageous embodiments are defined in the dependent claims.

These and other aspects of the invention will be apparent from and elucidated with reference to the embodiments described hereinafter.

DETAILED DESCRIPTION OF THE DRAWINGS

Figure 1:
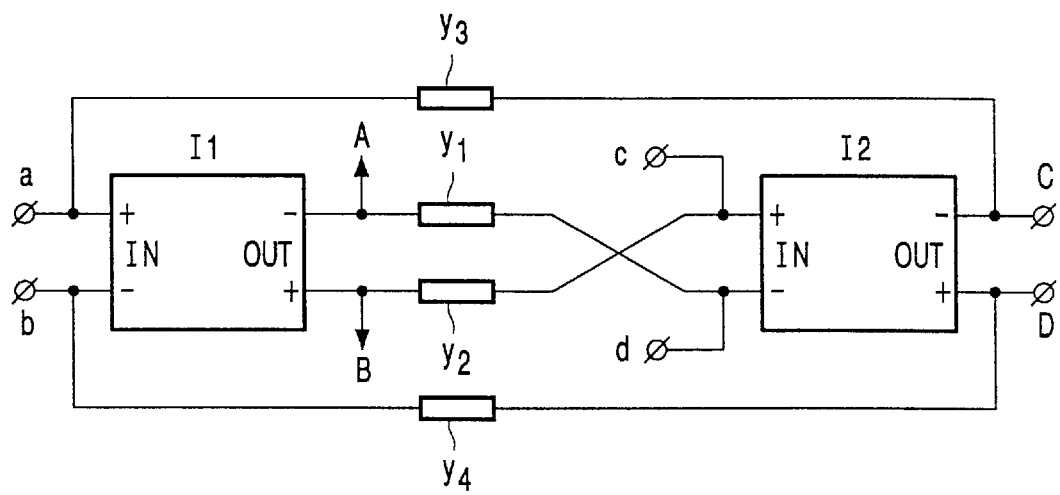
FIG. 1 shows an embodiment of a resonator.

The resonator shown in FIG. 1 is a so-called RC active resonator, which is suitable for IC implementation. The resonator of FIG. 1 comprises two integrators I1 and I2. These balanced integrators have a non-inverting input in+, an inverting input in−, a non-inverting output out+ and an inverting output out−. The input terminals a, b of the resonator are connected to the non-inverting input in+ and the inverting input in− of the integrator I1, while the output terminals D, C of the resonator are connected to the non-inverting output out+ and the inverting output out− of the second integrator I2. The inverting output out− of the first integrator I1 is connected to the inverting input in− of the second integrator I2 through an admittance Y1, while an admittance Y2 is interconnected between the non-inverting output out+ of the first integrator I1 and the non-inverting input in+ of the second integrator I2. In the feedback circuit the admittance Y3 is interconnected between the inverting output out− of the second integrator I2 and the non-inverting input in+ of the first integrator I1. The other feed-back circuit is the admittance Y4 which is interconnected between a non-inverting output out+ of the second integrator I2 and the inverting input in− of the first integrator I1. The admittances could also be transadmittances, giving currents in the integrator inputs.

The resonator of FIG. 1 is a polyphase resonator, which is controlled by means of 4 current sources, for example + and− of I and Q signals (not shown) at the 4 input terminals a, b and c, d of the two integrators I1, I2. The filtered polyphase signals could be taken from the outputs A, B and C, D of the two integrators I1, I2.

Figure 2:
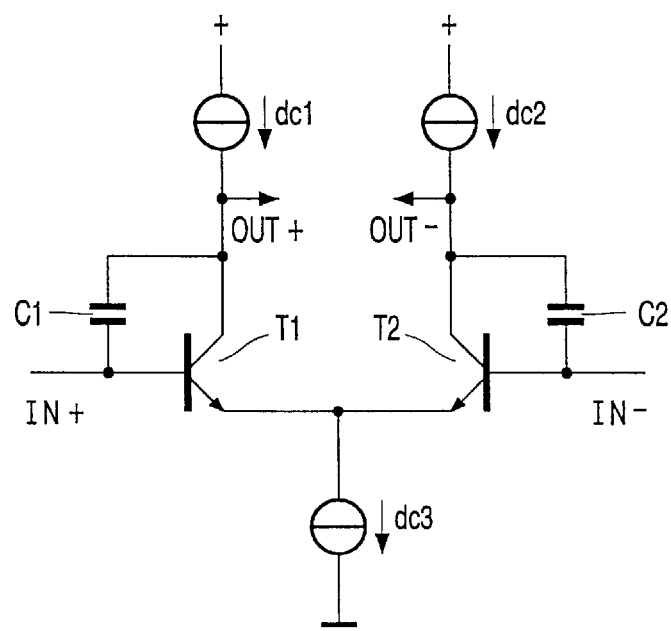
FIG. 2 illustrates an embodiment according to the invention of the integrator of FIG. 1.

According to a preferred embodiment of the invention, the integrating amplifiers shown in FIG. 2 are used as integrators I1 and I2. The integrating capacitors C1 and C2 are directly connected between the collector and base of each of the two transistors T1 and T2, with which the differential amplifier of FIG. 2 is constituted. The collectors or sources of the transistors T1, T2 are connected to the plus terminal of the supply voltage through current sources dc1 and dc2 respectively. The emitters or drains of the transistors T1, T2 are commonly connected through a current source dc3 to earth, the other terminal of the supply voltage. It is clear that a first differential amplifier is used for the first integrator I1 and the second differential amplifier of FIG. 2 is used for the integrator I2. The in+ and in− terminals of the first differential amplifier are connected to the input terminals a, b of the resonator, while the out+ and out− terminals of the first differential amplifier are connected to the admittances Y2 and Y1 respectively and in the polyphase embodiment to the output terminals B and A respectively of the resonator. The in+ and in− terminals of the second differential amplifier are connected to the admittances Y2 and Y1 respectively and in the polyphase embodiment also to the input terminals c and d respectively of the resonator. The out+ and out− terminals of the second differential amplifier are connected to the admittances Y4 and Y3 respectively as well as to the output terminals D, C of the resonator.

As shown in FIG. 2 the integrating capacitors C1, C2 are directly connected between the collector (drain) and base (gate) of each of the two transistors, by which direct connection a parasitic phase-shift in the differential amplifier is reduced and thus higher tuning frequencies could be obtained.

According to the invention, at least one of the coupling and feed-back circuits Y1, Y2, Y3 and Y4 comprise a series connection of a high-to-low impedance converter and a conductance. By using such a converter the load of the integrating amplifiers is reduced in order to increase to the amplification. Furthermore the dynamic range is improved.

Figure 3:
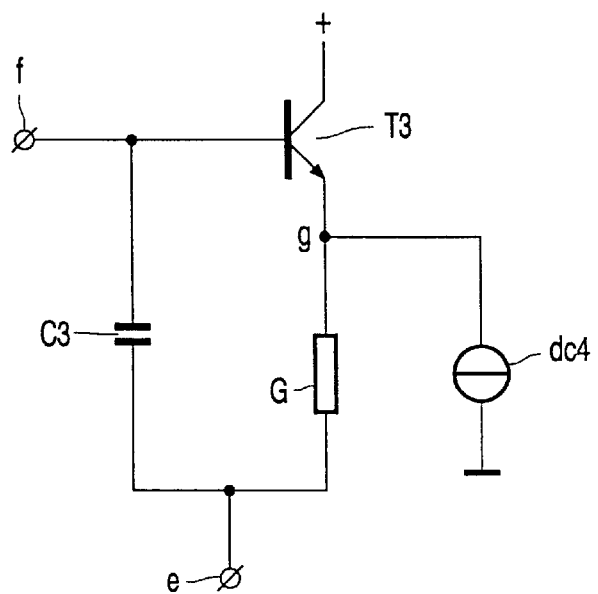
FIG. 3 indicates an embodiment according to the invention of the admittances of FIG. 1.

In the embodiment shown in FIG. 3, the high-to-low impedance converter is constituted by an emitter- or source-follower, the transistor T3. The collector (drain) of the transistor (T3) is connected to the plus terminal of the supply voltage and the emitter (source) of the transistor T3 is connected to one terminal of the conductance G, whereas the other terminal of the conductance is connected to the terminal e of the transadmittance. The current source dc4 is interconnected between the connecting point of the transistor T3 and the conductance G at the one side and at the other side to earth.

The base (gate) of the transistor T3 is connected to the terminal f of the transadmittance. The capacitor C3 is connected between the terminals f and e of the transadmittance and serves to limit the Q of the resonator and compensates for parasitic phase-shift of the integrating amplifiers. These capacitors C3 in the emitter-followers are preferred over resistors in parallel to the capacitors C1, C2 in the differential integrating amplifiers in view of the noise contribution. Furthermore the capacitors C3 are directly connected to the outputs of the integrating amplifiers in order to avoid a phase-shift of the emitter-followers.

The emitter-followers shift the DC level between input and output of the respective integrating amplifier to increase a voltage range at the collectors of those amplifiers. Consequently, the dynamic range is improved.

In summarizing the capacitor C3 limits the Q of the resonator and the conductance G serves the transmission.

Preferably the conductance is adjustable for tuning the resonator. The conductances G are implemented by MOS transistors to make the resonator tunable. A series connection of two MOS transistors is preferred to reduce the distortion of the controllable conductances.

Figure 4:
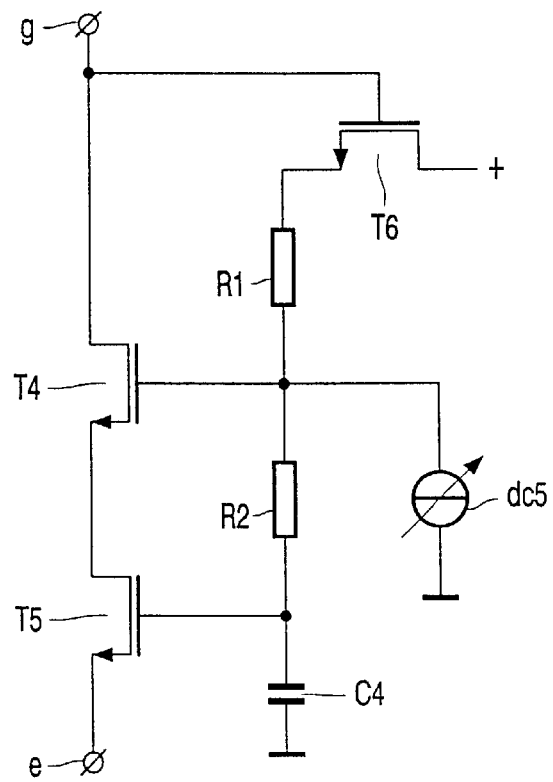
FIG. 4 a preferred embodiment of the conductance of FIG. 3.

An embodiment of two MOS transistors T4 and T5 is shown in FIG. 4. The terminals g, e correspond to the terminals g and e in FIG. 3.

The gate of the transistor T6 is connected to the terminal g. The drain of the transistor T6 is connected to the plus terminal of the supply voltage, while the source of said transistor T6 is coupled to the gate of the transistor T4 through the resistor R1. The gates of the transistor T4, T5 are coupled to each other through the resistor R2. The connecting point of the resistors R1, R2 and the gate of the transistor T4 is coupled to one terminal of variable current source dc5, the other terminal of which is connected to earth. The gates of the transistors T4 and T5 have the same DC balance, while the gate of the transistor T4 has halve of the AC signal, whereas the gate of the transistor T5 has no AC signal, for which e.g. a decoupling capacitor c4 can be used. The conductances between the terminals g, e are controllable by varying the current of the current source dc5.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. Resonator, comprising:

first and second balanced integrators (I1, I2) each having a non-inverting (in+) and an inverting (in−) input terminal, as well as a non-inverting (out+) and an inverting (out−) output terminal, first and second coupling circuits (Y1, Y2) between the non-inverting output terminal (out+) of the first integrator (I1) and the non-inverting input terminal (in+) of the second integrator (I2) and between the inverting output terminal (out−) of the first integrator (I1) and the inverting input terminal (in−) of the second integrator (I2), respectively, and feedback circuits (Y3, Y4) between the non-inverting output terminal (out+) of the second integrator (I2) and the inverting input terminal (in−) of the first integrator (I1) and between the inverting output terminal (out−) of the second integrator (I2) and the non-inverting input terminal (in+) of the first integrator (I1), respectively, wherein at least one of the coupling and feedback circuits (Y1, Y2, Y3, Y4) comprises a series connection of a high-to-low impedance converter (T3) and a conductance (G).

2. Resonator according to claim 1, wherein the high-to-low impedance converter is constituted by an emitter- or source-follower (T3).

3. Resonator according to claim 2, wherein a capacitor (C3) is connected between a control terminal of the said follower (T3) and a terminal of the conductance (G) that is not connected to an emitter or source terminal of the follower (T3).

4. Resonator according to claim 1, wherein the conductance (G) is adjustable.

5. Resonator according to claim 4, wherein the conductance (G) is constituted by a MOS transistor, to a control terminal of which a controllable current source is coupled.

6. Resonator according to claim 4, wherein the conductance (G) is constituted by a series connection of at least two MOS transistors (T4, T5), to control terminals of which a controllable current source (dc5) is coupled.

7. Resonator as claimed in claim 1, wherein the balanced integrators (I1, I2) include two semiconductor elements (T1, T2) interconnected as a differential amplifier, in which a feedback capacitor (C1, C2) is coupled between the output terminal (out+, out−) and the input terminal (in+, in−) of each semiconductor element (T1, T2).

8. Resonator as claimed in claim 7, wherein the feedback capacitor (C1, C2) is directly connected between the output terminal (out+, out−) and the input terminal (in+, in−) of each semiconductor element (T1, T2).

9. Polyphase resonator comprising 4 input (a, b, c, d), 4 output terminals (A, B, C, D) and the resonator according to claim 7, wherein said 4 input and output terminals are connected to the corresponding input and output terminals of the semiconductor elements (T1, T2) of the differential amplifiers.

* * * * *